United States Patent [19]

Colleran et al.

[11] Patent Number: 5,344,338
[45] Date of Patent: Sep. 6, 1994

[54] STRAIN RELIEF STRUCTURE FOR CONNECTING FLAT FLEXIBLE CABLE TO A CIRCUIT BOARD

[75] Inventors: Stephen A. Colleran, Lisle; Robert J. Gugelmeyer, Naperville; Lawrence E. Geib, Bartlett; Kenneth T. Stead, Aurora, all of Ill.; Weng H. Cheong, Kokomo, Ind.

[73] Assignee: Molex Incorporated, Lisle, Ill.

[21] Appl. No.: 20,246

[22] Filed: Feb. 19, 1993

Related U.S. Application Data

[63] Continuation of Ser. No. 845,896, Mar. 4, 1992, abandoned.

[51] Int. Cl.$^5$ .................. H01R 13/58; H02G 15/00
[52] U.S. Cl. ........................... 439/465; 174/135; 439/493; 439/499
[58] Field of Search ............ 439/460, 465, 492–499; 174/135

[56] References Cited

U.S. PATENT DOCUMENTS

| | | | |
|---|---|---|---|
| 4,705,482 | 11/1987 | Endo et al. | 439/492 |
| 4,886,942 | 12/1989 | Lenz et al. | 439/493 |
| 4,955,814 | 9/1990 | Christie et al. | 439/77 |

FOREIGN PATENT DOCUMENTS

| | | |
|---|---|---|
| 3004072 | 2/1980 | Fed. Rep. of Germany . |
| 63-31490 | 8/1988 | Japan ........................... 439/493 |

*Primary Examiner*—Steven C. Bishop
*Attorney, Agent, or Firm*—A. A. Tirva

[57] ABSTRACT

A strain relief structure is provided for connecting a flat flexible cable to a circuit board. The flat flexible cable includes an array of parallel conductors, flexible insulation disposed around the conductors and a web of insulation disposed between adjacent conductors. The strain relief structure includes a body having at least one cable receiving aperture extending therethrough. A deflectable strain relief extends into the cable receiving aperture for engaging the web of insulation between at least a pair of conductors. Transverse walls, independent of the strain relief structure, extend into the cable receiving aperture for biasing at least one of the conductors out of the plane of the flat flexible cable.

9 Claims, 3 Drawing Sheets

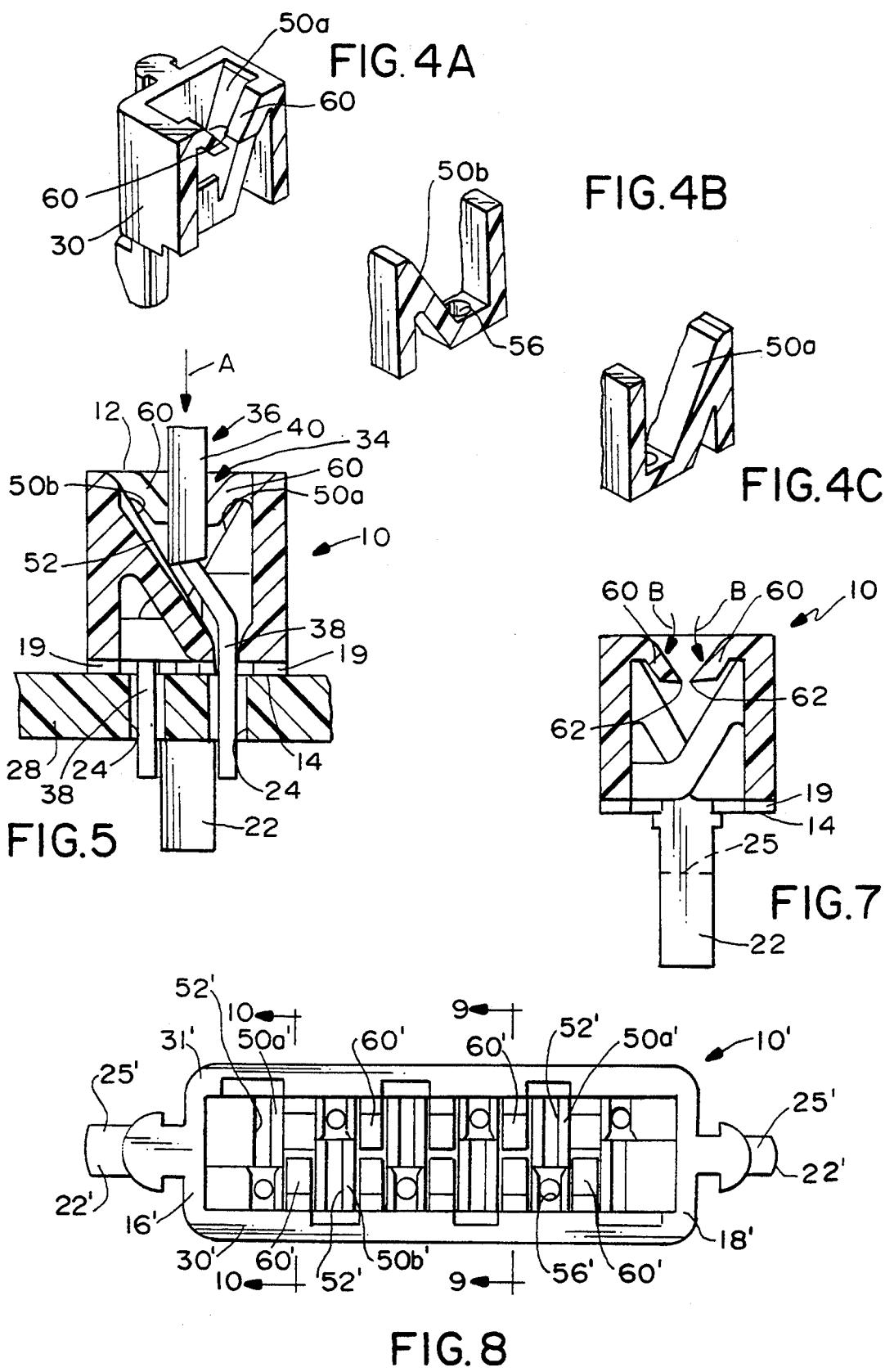

STRAIN RELIEF STRUCTURE FOR CONNECTING FLAT FLEXIBLE CABLE TO A CIRCUIT BOARD

This is a continuation of copending application(s) Ser. No. 07/845,896 filed on Mar. 4, 1992, now abandoned.

FIELD OF THE INVENTION

This invention generally relates to the art of electrical connections and, particularly, to improvements in strain relief structures for connecting flat flexible or ribbon cable to a printed circuit board.

BACKGROUND OF THE INVENTION

Electrical devices often comprise cables which extend from one printed circuit board to another or from a printed circuit board to an electrical component. In many instances, the cable is a flat flexible cable having a plurality of generally parallel conductors with flexible insulation disposed around and between the respective conductors. In some instances, an electrical connector with terminals therein is mounted to the printed circuit board, such that the terminals of the connector are electrically connected to the conductive areas on the circuit board. A cable then may be terminated to a second electrical connector which can be mated to the board-mounted connector. Connections of this type are employed when it is necessary to periodically separate the cable from the circuit board. However, these mateable pairs of connectors are relatively expensive and can represent a substantial cost penalty in the highly competitive electronics industry. As a result, it is desirable to directly and permanently connect the conductors of the cable to the conductive areas on the circuit board in situations where periodic disconnection will not be required. This direct connection of the cable to the circuit board can result in substantial cost savings and manufacturing efficiencies. In particular, the respective conductive leads of the cable can be soldered directly to the conductive areas on the circuit board without mateable pairs of terminals and connector housings.

The direct connection of the conductive leads in the cable to the conductive areas on the circuit board must provide for strain relief. In particular, stresses exerted on the cable either during assembly of the electrical apparatus or during use of the apparatus may create strains that could damage the soldered connection between the leads of the cable and the conductive areas on the circuit board.

U.S. Pat. No. 4,886,942 to Lenz et al., dated Dec. 12, 1989 and assigned to the assignee of this invention, discusses prior art relating to structures to provide strain relief for direct cable to circuit board electrical connections. The Lenz et al. patent discloses a new and improved strain relief structure which has various stated advantages over the prior art. Specifically, the Lenz et al. patent is directed to a strain relief structure comprising a body having at least one slot or aperture for receiving a cable therein. The cable may be prepared or stripped prior to insertion into the strain relief structure such that the terminal portions of the conductive leads are exposed for subsequent electrical connection to conductive areas on a circuit board. The cable may be a flat flexible cable having a plurality of conductive leads disposed in a parallel array. The preparation of the end of the flat flexible cable may comprise removing portions of the insulation between the cables for a selected distance from the end of the cable. Thus, the extreme end of the flat flexible cable may have all insulation stripped away such that the uninsulated conductive leads extend from the end of the cable. A portion of the flat flexible cable adjacent the stripped end may include insulation around each individual conductive lead, but with the insulation webs between adjacent leads at least partly removed.

The strain relief structure of the Lenz et. al. patent comprises at least one strain relief means extending into the cable receiving slot or aperture. The strain relief means may be angularly aligned with respect to the direction of insertion to be deflected by the insertion of the cable into the slot or aperture. However, the angular alignment and the configuration of the strain relief means enables engagement of the insulation on the cable to substantially prevent withdrawal of the cable and provide strain relief. The strain relief means may comprise at least one deflectable finger.

The strain relief structure of the Lenz et. al. patent can be employed by mounting the cable and the strain relief structure to one another prior to mounting on a circuit board. In particular, the prepared cable and the strain relief structure can be shipped and/or stored in an initially assembled condition prior to mounting of the cable and strain relief structure on a circuit board. Additionally, the strain relief means of the structure will have already engaged the cable to prevent unintended separation of the strain relief structure from the cable prior to installation on the circuit board.

The initially assembled cable and strain relief structure then can be securely mounted to the circuit board with the leads of the cable in a protected properly aligned condition relative to the conductive areas, through holes or other such conductive lead receiving means on the circuit board. The strain relief structure thus ensures proper alignment of the exposed conductors during installation on the circuit board and greatly facilitates component assembly.

SUMMARY OF THE INVENTION

The present invention is directed to an improved strain relief structure of the type shown in the Lenz et al. patent.

Specifically, as stated above, in Lenz et al., the strain relief means or deflectable fingers engage the insulation disposed around the conductors of the flat flexible cable. Consequently, the strain relief structure is dependent upon the size or gauge of the conductor wires. The present invention provides strain relief against the web portions of the insulation between the conductors whereby varying sizes of conductors can be accommodated by a single strain relief structure. In addition, the strain relief structure contemplates alternating the deflectable fingers on opposite sides of the flat flexible cable between alternating pairs of conductors to reduce the insertion force of the cable into the strain relief structure and thereby accommodate flat flexible cables of large numbers of conductors.

An object, therefore, of the invention is to provide an improved strain relief structure of the character described.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings in which like reference numerals identify like elements in the figures and in which:

FIGS. 4a, 4B and 4C are vertical sections taken generally along lines 4A—4A, 4B—4B and 4C—4C of FIG. 2;

FIG. 5 is a vertical section taken generally along line 5—5 of FIG. 2;

FIG. 7 is a vertical section taken generally along line 7—7 of FIG. 2;

FIG. 8 is a top plan view similar to that of FIG. 2, of an alternate form of the invention;

DETAILED DESCRIPTION OF THE PREFERRED EMBODIMENTS

Figure 6:
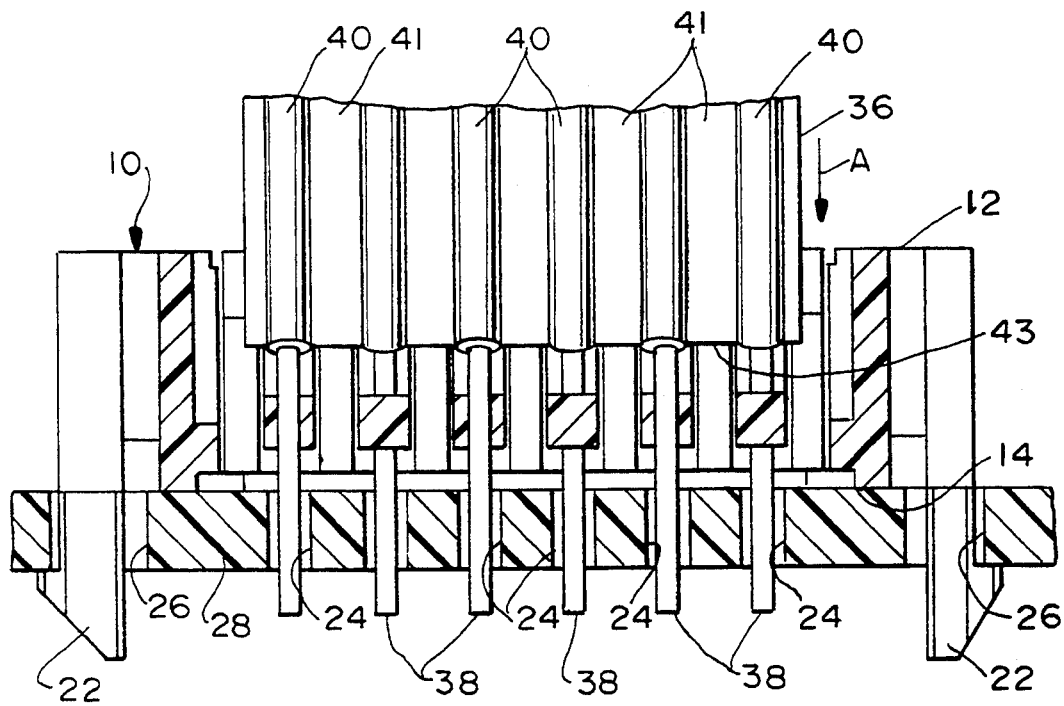
FIG. 6 is a vertical section taken generally along line 6—6 of FIG. 2.

Referring to the drawings in greater detail, and first to the embodiment of the invention shown in FIGS. 1–7, the invention is incorporated in a strain relief structure, generally designated 10, which is a unitarily molded component from plastic material, including a body having a top surface 12, a bottom board-mounting surface 14 and opposed end walls 16 and 18 extending between the top and bottom surfaces. Stand-offs 19 depend from bottom surface 14 and are the portions of the structure which actually engage the circuit board as shown in FIGS. 5 and 6. End walls 16 and 18 include bifurcated mounting pegs 22 which extend beyond the bottom of stand-offs 19. Fins or flanges on the bifurcated mounting pegs define locking shoulders 25 which snap beneath a bottom surface of the circuit board. Specifically, the bifurcated mounting pegs deform to achieve an interference fit with appropriately dimensioned apertures 26 (FIG. 6) in a printed circuit board 28 to securely mount strain relief structure 10 to the printed circuit board, as the deformable bifurcated mounting pegs snap outwardly to seat shoulders 25 under the bottom surface of the printed circuit board.

Strain relief structure 10 further includes front and rear walls 30 and 31, respectively, which extend between opposed top and bottom surfaces 12 and 14, respectively, and between opposed end walls 16 and 18. A cable receiving aperture is generally indicated by the reference numeral 34. The aperture extends into top surface 12 of the strain relief structure and toward the bottom board mounting surface 14. The aperture is constructed and dimensioned specifically to receive a flat flexible cable, generally designated 36 (FIGS. 5–7) having a plurality of substantially parallel conductive leads or conductors 38 disposed within a substantially flexible resilient insulation. The insulation includes flexible insulation portions 40 disposed around conductors 38 and webs of insulation 41 disposed between the conductors. In other words, the webs of insulation generally form a planer structure interrupted transversely by the insulated conductors. The cable is prepared as shown at 43 best in FIG. 6 by stripping insulation 40, 41 from conductors 38 a distance from the ends of the conductors sufficient for the conductors to extend beyond strain relief structure 10 and through holes 44 in printed circuit board 28 whereby the conductors can be terminated, as by soldering, to circuit traces on the board and/or in the holes.

A plurality of transverse walls 50a and 50b extend orthogonally into cable receiving aperture 34 and function to divide portions of the aperture into cavities for receiving the discrete conductors 38 of flat flexible cable 36. Specifically, the transverse walls extend at an acute angle to the insertion direction of flat flexible cable 36, as indicated by arrow "A" in FIG. 5. Actually, each transverse wall 50a and 50b includes a recessed trough 52 for guiding the conductors downwardly through cable receiving aperture 34 and out through the bottom of the strain relief structure and into holes 24 in circuit board 28. It can be seen by wall 50b in FIG. 5 that the conductor 38 shown therein has been biased or cammed out of the overall plane of flat flexible cable 36.

Figure 1:
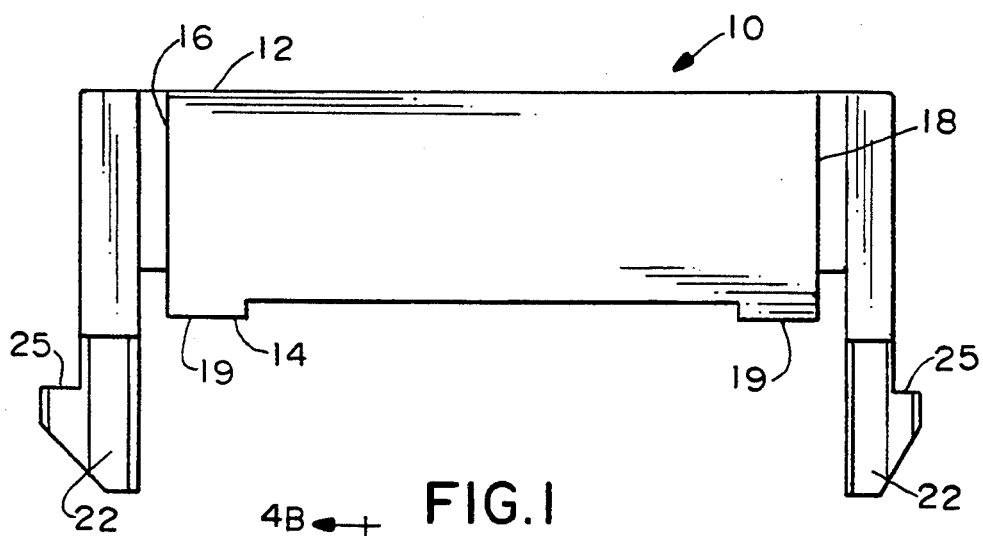
FIG. 1 a front elevational view of the strain relief structure of the invention.
Figure 2:
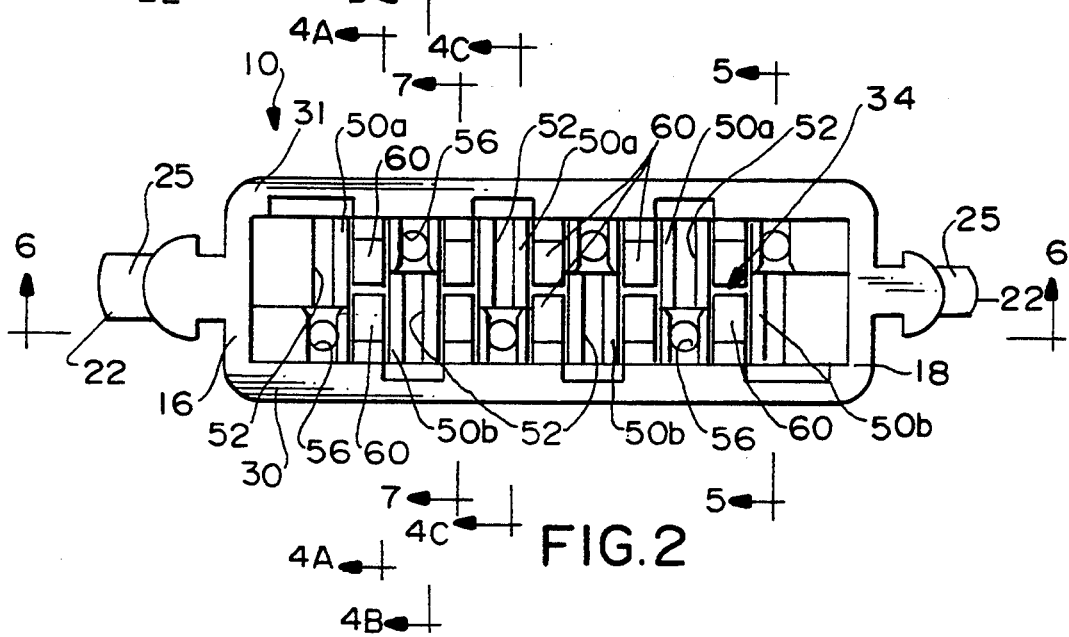
FIG. 2 is a top plan view of the strain relief structure.
Figure 3:
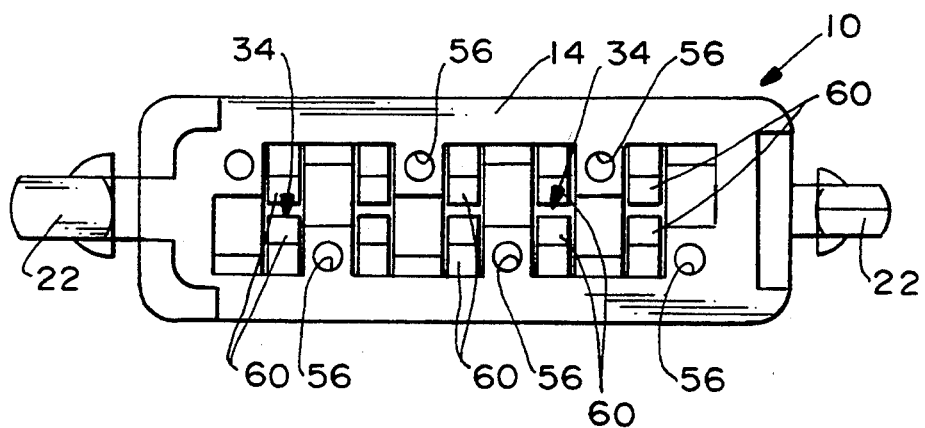
FIG. 3 is a bottom plan view of the strain relief structure.

More particularly, the invention contemplates that transverse walls 50a and 50b be alternatingly oriented in opposite directions so that conductors 38 are insertable into holes 24 in two rows of holes in the printed circuit board. This alternating orientation is best shown in FIG. 2 where it can be seen that alternating transverse walls 50a extend orthogonally from rear wall 31 into cable receiving aperture 34, and transverse walls 50b extend orthogonally from front wall 30. The transverse walls, particularly troughs 52 thereof, guide conductors 38 to and through openings or holes 56 which exit out of bottom surface 14 of the strain relief structure as best seen in FIGS. 3, 4B and 4C.

Generally, the invention contemplates a strain relief means extending into cable receiving aperture 34 for engaging the webs of insulation 41 between conductors 38 and their surrounding insulation 40. More particularly, the strain relief means are provided in the form of deflectable fingers 60 which are cantilevered downwardly at an acute angle from top surface 12 of the strain relief structure as best seen in FIGS. 5 and 7. Each finger 60 terminates in a point 62 for grippingly engaging insulation webs 41. As seen in FIGS. 2 and 3, a pair of strain relief fingers 60 extend into cable receiving aperture 34 in opposing directions from front and rear walls 30 and 31 of the strain relief structure between each adjacent pairs of oppositely oriented transverse walls 50a and 50b.

The use of strain relief structure 10 can best be understood with reference to FIGS. 4–7. In particular, flat flexible cable 36 is stripped of insulation and prepared substantially as shown in FIG. 6. The prepared end of the cable then is inserted into cable receiving aperture 34 of strain relief structure 10 in the direction of arrows "A". This is done prior to mounting the strain relief structure onto circuit board 28 and typically prior to shipping the prepared cable and strain relief structure to a location for assembly onto a circuit board. Cable 36 is generally aligned parallel to front and rear walls 30 and 31 of the strain relief structure during this initial insertion. As the cable is inserted into the cable receiving aperture of the strain relief structure, stripped conductors 38 alternatingly engage transverse walls 50a and 50b (i.e., in troughs 52 of the transverse walls), whereupon the transverse walls bias or cam the conductors alternatingly in opposite transverse directions as shown best by the two conductors 38 shown in FIG. 5. The conductors exit holes 56 in bottom wall 14 of the strain relief structure whereby the conductors project in two rows of alternating conductors along the length of the strain relief structure. By using transverse walls 50a and 50b, independent of strain relief fingers 60, for biasing the conductors, insertion forces of the cable are reduced.

As flat flexible cable 36 is inserted into cable receiving aperture 34 of strain relief structure 34 as described above, and referring to FIG. 7, insulation webs 41 engage points 62 of deflectable strain relief fingers 60 and bias or cam the fingers downwardly and outwardly in the direction of arrows "B". When the cable is fully inserted into the strain relief structure, the deflectable fingers, particularly points 62 thereof, lockingly grip insulation webs 41, thereby preventing withdrawal of cable 36 and providing the required strain relief. Obviously, the withdrawal force on the cable is greater than the insertion force. With the strain relief fingers gripping insulation webs 41 rather than insulation 40 about conductors 38, different sizes or gauges of conductors can be accommodated by the strain relief structure of the invention simply by maintaining the thickness of insulation webs 41 of a constant dimension.

Although FIGS. 1–7 illustrate a strain relief structure for receiving a flat flexible cable having six conductors 38, the principles of the invention are equally applicable for providing a much longer strain relief structure for receiving a flat flexible or ribbon cable having a considerable number of conductors. Consequently, the insertion force of the cable into the strain relief structure can be considerable. To this end, FIGS. 8–9 show an alternate form of the invention wherein "primed" reference numerals have been added corresponding to complementarily functioning components described above in relation to the embodiment of FIGS. 1–7.

Figures 9, 10:
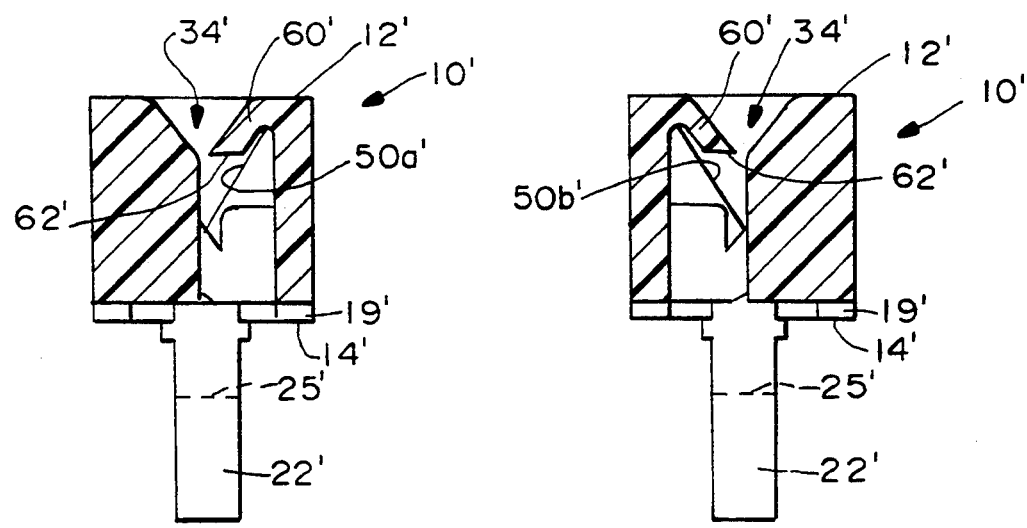
FIG. 9 is a vertical section taken generally along line 9—9 of FIG. 8.
FIG. 10 is a vertical section taken generally along line 10—10 of FIG. 8.

It can be seen in the embodiment of FIGS. 8–10, particularly in comparing FIGS. 9 and 10, that a single deflectable finger 60' extends into cable receiving aperture 34 between each pair of alternating pairs of transverse walls 50a' and 50b'. The deflectable fingers function the same as described above in relation to the embodiment of FIGS. 1–7, specifically in grippingly engaging insulation webs 41 between the insulated conductors. However, by employing alternating single fingers versus pairs of opposing fingers, the insertion force of any given flat flexible cable can be reduced by approximately one-half.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. In a strain relief structure for connecting conductors of a flat flexible cable directly to conductive areas of a circuit board, the flat flexible cable including an array of parallel conductors, flexible insulation disposed around the conductors and a web of insulation disposed between adjacent conductors, the strain relief structure including a body having a cable receiving aperture extending therethrough, wherein the improvement comprises a plurality of resilient strain relief fingers extending into the cable receiving aperture from each side of said cable receiving aperture each resilient finger arranged for grippingly engaging the web of insulation between a pair of conductors independently of any other finger.

2. In a strain relief structure as set forth in claim 1, wherein each said finger terminates in a point disposed within the cable receiving aperture, the point being grippingly engageable with said web of insulation to prevent withdrawal of the cable from the strain relief structure.

3. In a strain relief structure as set forth in claim 2, wherein said strain relief structure is unitarily molded of plastic material.

4. In a strain relief structure as set forth in claim 1, wherein said strain relief fingers include at least a pair of fingers extending into the cable receiving aperture for grippingly engaging opposite sides of said web of insulation between different pairs of adjacent conductors.

5. In a strain relief structure as set forth in claim 4, wherein said fingers terminate in points disposed within the cable receiving aperture, the points being grippingly engageable with said web of insulation to prevent withdrawal of the cable from the strain relief structure.

6. In a strain relief structure as set forth in claim 1, wherein a strain relief end of said cable is prepared by removing portions of the web of insulation between adjacent conductors for a selected length from the end of the cable, and wherein the strain relief structure includes wall means, independent of said strain relief fingers, extending into the cable receiving aperture for biasing at least one of the conductors out of the plane of the flat flexible cable.

7. In a strain relief structure as set forth in claim 6, wherein said wall means define a cam surface extending at an acute angle into the cable receiving aperture.

8. In a strain relief structure as set forth in claim 6, wherein said wall means include transverse wall portions for biasing alternating ones of the conductors to one side of the plane of the flat flexible cable.

9. In a strain relief structure as set forth in claim 8, wherein said wall means include additional transverse wall portions for biasing the other ones of the conductors to the opposite side of the plane of the flat flexible cable.

* * * * *